(12) United States Patent
So et al.

(10) Patent No.: US 7,566,958 B2
(45) Date of Patent: Jul. 28, 2009

(54) MULTI-CHIP PACKAGE FOR REDUCING PARASITIC LOAD OF PIN

(75) Inventors: Byung-Se So, Seongnam (KR); Dong-Ho Lee, Seongnam (KR); Hyun-Soon Jang, Seoul (KR)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/589,192

(22) Filed: Oct. 30, 2006

(65) Prior Publication Data

US 2007/0040280 A1 Feb. 22, 2007

Related U.S. Application Data

(62) Division of application No. 10/722,159, filed on Nov. 26, 2003, now Pat. No. 7,148,563.

(30) Foreign Application Priority Data

Dec. 2, 2002 (KR) .............................. 2002-75805

(51) Int. Cl.
*H01L 23/02* (2006.01)
(52) U.S. Cl. .................. 257/685; 257/723; 257/786; 257/E25.006; 257/E25.027
(58) Field of Classification Search .................. 257/685, 257/686, 723, 730, 731, 773, 784, 786, E25.006, 257/E25.013, E25.021, E25.027, E21.614, 257/777, 209, 698, 692
See application file for complete search history.

(56) References Cited

U.S. PATENT DOCUMENTS

| 6,621,155 | B1 | 9/2003 | Perino et al. |
| 2002/0096784 | A1* | 7/2002 | Kamikuri et al. ............. 257/778 |
| 2003/0015733 | A1 | 1/2003 | Hayashi et al. |
| 2003/0028835 | A1 | 2/2003 | Ishikawa |
| 2003/0234674 | A1 | 12/2003 | Morgan |

* cited by examiner

*Primary Examiner*—A. Sefer
*Assistant Examiner*—Dilinh P Nguyen
(74) *Attorney, Agent, or Firm*—Volentine & Whitt, PLLC (57) ABSTRACT

Multi-chip package includes first through Nth semiconductor chips, each of which includes an input/output pad, an input/output driver coupled to the input/output pad, and an internal circuit. Each of the first through Nth semiconductor chips includes an internal pad for coupling the internal input/output driver and the internal circuit. The internal pads of the first through Nth semiconductor chips are coupled to each other such as via a common pad installed at a substrate. The input/output pad of the first semiconductor chip directly receives an input/output signal transmitted via a corresponding pin of the multi-chip package. The second through Nth semiconductor chips indirectly receive the input/output signal via the internal pads coupled to each other. The multi-chip package can improve signal compatibility by maintaining a parasitic load of a pin to at least the level of a single chip, when a signal is transmitted to the pin at high speed. Also, when a signal that is not necessarily transmitted at high speed is applied to a pin, semiconductor chips can be packaged according to the pre-existing methods.

11 Claims, 8 Drawing Sheets

MULTI-CHIP PACKAGE FOR REDUCING PARASITIC LOAD OF PIN

CROSS REFERENCES TO RELATED APPLICATIONS

This is a divisional of U.S. patent application Ser. No. 10/722,159, filed 26 Nov. 2003 now U.S. Pat. No. 7,148,563, the contents of which are incorporated herein by reference in their entirety, and also claims the priority benefit under 35 U.S.C. § 119 from Korean Patent Application No. 2002-75805, filed on Dec. 2, 2002, the contents of which are also incorporated herein by reference in their entirety.

BACKGROUND AND SUMMARY

1. Technical Field

The present invention relates to multi-chip packages, and more particularly, to a multi-chip package which can minimize the parasitic load of a package pin by adjusting the number of chips coupled to the package pin.

2. Description

In recent years, multi-chip package techniques for incorporating several memory chips into a single package have been widely used to increase memory capacity. However, in typical multi-chip packages, a parasitic load of a package pin is proportional to the number of embedded memory chips. An increased parasitic load impedes high-speed transmission of signals input to the package pin. Accordingly, it is imperative for the multi-chip packages to reduce the parasitic load of the package pin to at least the level of the parasitic load of a single chip.

Figure 1:
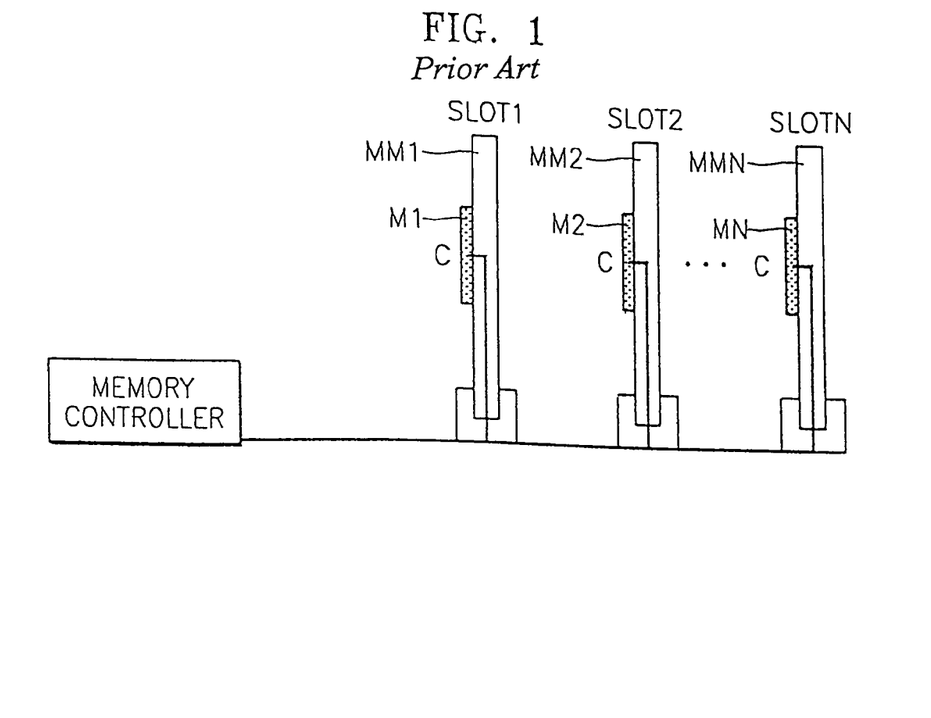
FIG. 1 is a diagram of a memory bus coupled to n memory modules, each of which includes memory.

FIG. 1 is a diagram of a memory bus coupled to N memory modules, each of which includes a memory device.

Referring to FIG. 1, N memory modules MM1, MM2, . . . , and MMN are mounted on N memory slots SLOT1, SLOT2, . . . , SLOTN. Each of the memory modules MM1, MM2, . . . , and MMN includes a memory device M1, M2, . . . , and MN, respectively. In FIG. 1, C represents an input capacitance of each of the memory modules MM1, MM2, . . . , and MMN.

High-performance memory systems are required to connect more memory per channel and simultaneously transmit signals faster. The amount of memory connected to one channel is limited in order to transmit signals at high speed.

The memory bus of FIG. 1 has an input capacitance of N×C, and the capacitance has the same effect as a load on signal transmission. That is, as N increases, it becomes difficult to transmit signals at high speed. In a typical stub-type memory bus, the number of slots for mounting memory modules is limited to four or less.

In general, while the number of memory slots is limited, to secure maximum memory capacity a memory module is manufactured by stacking several packages, or mounting several chips in a single package.

However, even if a stacked package or a multi-chip package is used, in a case that requires an increased transmission rate of signals, it is still difficult to transmit signals at high speed due to the entire load of signal transmission lines. Also, to secure signal compatibility, packages such as multi-chips may not be used and the number of memory slots is more strictly limited.

Figure 2:
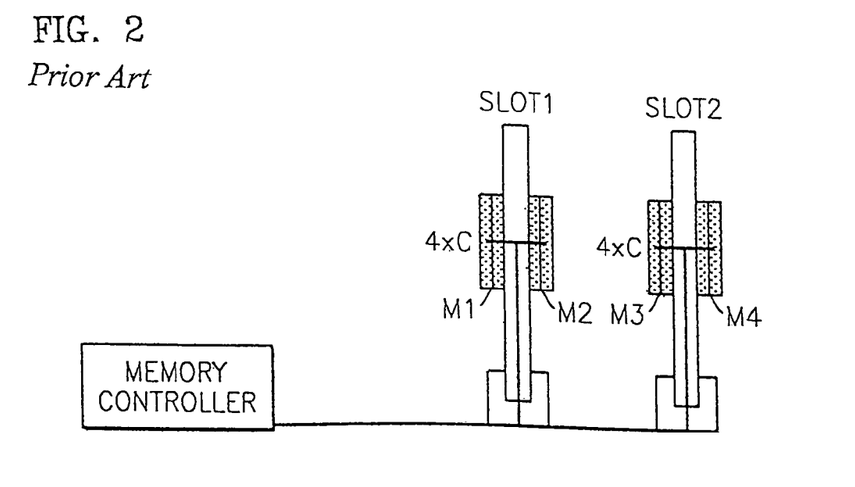
FIG. 2 is a diagram of a memory bus, in which the number of memory slots is limited to 2.

FIG. 2 is a diagram of a memory bus, in which the number of memory slots is limited to two.

Referring to FIG. 2, a first memory module MM1 includes two multi-chip devices M1 and M2, each of which includes two semiconductor chips. A second memory module MM2 includes two multi-chip devices M3 and M4, each of which also includes two semiconductor chips. Thus, the memory bus of FIG. 2 has an input capacitance of 8×C.

Figure 3:
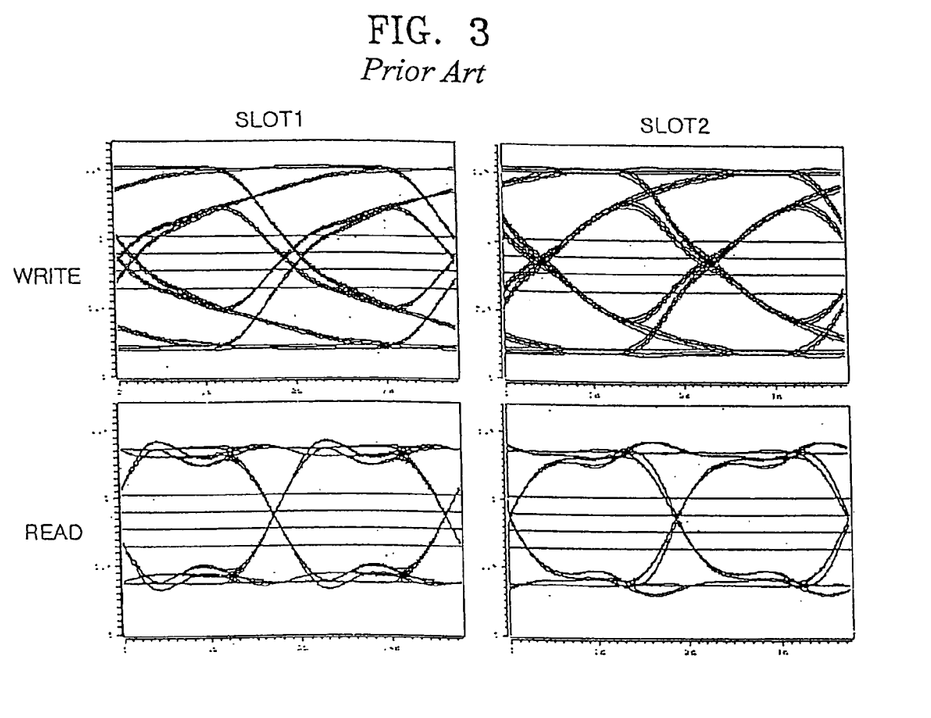
FIG. 3 is a diagram illustrating signal compatibility in relation to operations of the memory bus of FIG. 2.

FIG. 3 is a diagram illustrating signal compatibility in relation to operations of the memory bus of FIG. 2.

In FIG. 3, the horizontal axis is the time axis and the vertical axis is the voltage axis.

It can be seen that both the first and second slots SLOT1 and SLOT2 exhibit low signal compatibility for write and read operations.

Figure 4:
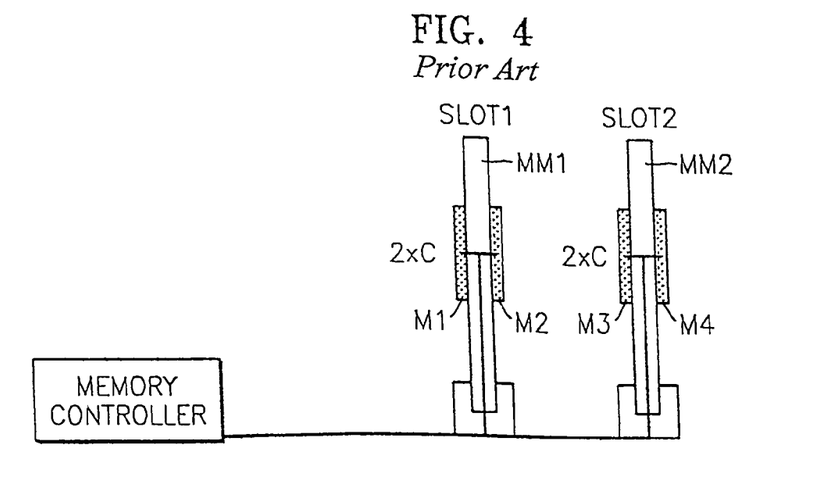
FIG. 4 is a diagram of a memory bus, in which the number of memory chips is reduced as compared to the memory module of FIG. 2.

FIG. 4 is a diagram of a memory bus, in which the number of memory chips is reduced when compared to the memory module of FIG. 2.

Figure 5:
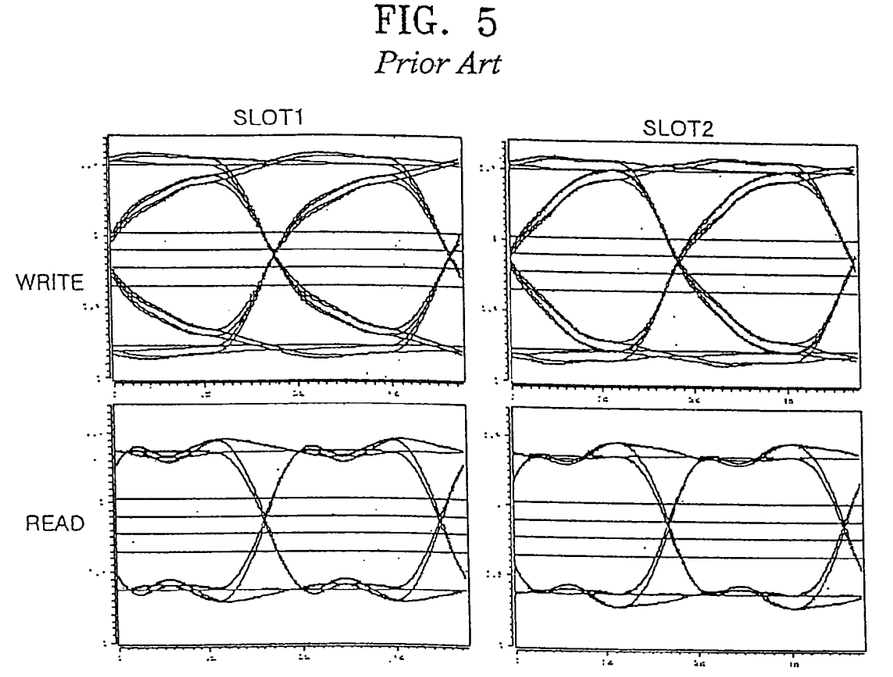
FIG. 5 is a diagram illustrating signal compatibility in relation to operations of the memory bus of FIG. 4.

FIG. 5 is a diagram illustrating signal compatibility in relation to operations of the memory bus of FIG. 4.

Referring to FIG. 4, a first memory module MM1 includes only two semiconductor chips M1 and M2, and a second memory module MM2 also includes only two semiconductor chips M3 and M4. Thus, the memory bus of FIG. 4 has an input capacitance of 4×C.

Referring to FIG. 5, when the input capacitance of the memory bus in FIG. 4 is reduced compared to the input capacitance of the memory bus in FIG. 2, then the signal compatibility is improved. Therefore, minimizing the parasitic load of a package pin improves the signal compatibility in a memory bus where signals are transmitted at high speed.

The present invention provides a multi-chip package which can minimize the parasitic load of a package pin and improve signal compatibility in a memory bus using memory modules supporting multiple semiconductor chips.

In accordance with an aspect of the present invention, there is provided a multi-chip package, comprising first through Nth semiconductor chips, each of which includes an input/output pad, an input/output driver coupled to the input/output pad, and an internal circuit. Each of the first through Nth semiconductor chips includes an internal pad for coupling the internal input/output driver and the internal circuit. The internal pads of the first through Nth semiconductor chips are coupled to each other. The input/output pad of the first semiconductor chip directly receives an input/output signal transmitted via a corresponding pin of the multi-chip package. The second through Nth semiconductor chips indirectly receive the input/output signal via the internal pads coupled to each other.

The internal pads are coupled to each other via a common pad installed at a substrate. The input/output pad of the first semiconductor chip is bonded to an external pin of the multi-chip package.

Each of the first through (N−1)th semiconductor chips includes a delay circuit for receiving the input/output signal at the moment the internal circuit of the Nth semiconductor chip receives the input/output signal.

In accordance with another aspect of the present invention, there is provided a multi-chip package, comprising first through Nth semiconductor chips, each of which includes an input/output pad, an input/output driver coupled to the input/output pad, and an internal circuit. Each of the first through Nth semiconductor chips includes an internal pad for coupling the internal input/output driver and the internal circuit. The internal pads of the first through Nth semiconductor chips are coupled to each other. The input/output pad of the first semiconductor chip directly receives an input/output signal transmitted via a corresponding pin of the multi-chip package. The second through Nth semiconductor chips indirectly receive the input/output signal via the internal pads coupled to each other. The first through Nth semiconductor chips include direct input/output pads, which directly receive predetermined external signals input via corresponding pins of the multi-chip package.

The internal pads are coupled to each other via a common pad installed at a substrate. The input/output pad of the first semiconductor chip is bonded to an external pin of the multi-chip package.

Each of the first through (N−1)th semiconductor chips includes a delay circuit for receiving the input/output signal at the moment the internal circuit of the Nth semiconductor chip receives the input/output signal. The external signals are transmitted at a lower speed than the input/output signals.

In accordance with still another aspect of the present invention, there is provided a multi-chip package, comprising first through Nth semiconductor chips, each of which includes first through Nth (N is a natural number) input/output pads, first through Nth input/output drivers coupled to the input/output pads, and an internal circuit. Each of the first through Nth semiconductor chips includes first through Nth internal pads for coupling the internal input/output drivers and the internal circuit. The first through Nth internal pads of the first semiconductor chip are coupled to the corresponding first through Nth internal pads of the second through Nth semiconductor chips. Predetermined first through Nth input/output signals are received via corresponding pins of the multi-chip package. An input/output signal for each semiconductor chip is received by the corresponding input/output pad. The first through Nth semiconductor chips indirectly receive the other input/output signals via the corresponding internal pads, which are coupled to each other.

The first through Nth internal pads are coupled to each other via first through Nth common pads installed at a substrate. The first through Nth semiconductor chips include delay circuits for controlling delay times of the input/output signals, such that the input/output signals received by the first through Nth semiconductor chips are simultaneously input to the internal circuit.

The first through Nth semiconductor chips further include direct input/output pads, which directly receive predetermined external signals input via corresponding pins of the multi-chip package. The external signals are transmitted at a lower speed than the input/output signals.

In accordance with further another aspect of the present invention, there is provided a multi-chip package, comprising first through Nth semiconductor chips, each of which includes a plurality of input/output pads, a plurality of input/output drivers coupled to the input/output pads, and an internal circuit. Each of the first through Nth semiconductor chips includes internal pads. The total number of internal pads equals that of the internal input/output drivers, the internal pads used for coupling the input/output drivers and the internal circuit. The plurality of internal pads of the first semiconductor chip are coupled to the plurality of internal circuits corresponding thereto of the second through Nth semiconductor chips. Among predetermined first through Mth (M>N, M is a natural number) input/output signals received via pins of the multi-chip package, the input/output signals are divided and transmitted directly to the input/output pads of the first through Nth semiconductor chips. The first through Nth semiconductor chips indirectly receive the other input/output signals via the corresponding internal pads, which are coupled to each other.

The plurality of internal pads are coupled to each other via a plurality of corresponding common pads installed at a substrate. The first through Nth semiconductor chips include delay circuits for controlling delay times of the input/output signals, such that the input/output signals received by the first through Nth semiconductor chips are simultaneously input to the internal circuit.

The first through Nth semiconductor chips further include direct input/output pads, which directly receive predetermined external signals input via corresponding pins of the multi-chip package. The external signals are transmitted at a lower speed than the input/output signals.

BRIEF DESCRIPTION OF THE DRAWINGS

The above features and advantages of the present invention will become more apparent by describing in detail exemplary embodiments thereof with reference to the attached drawings in which.

DETAILED DESCRIPTION

The present invention will now be described more fully with reference to the accompanying drawings, in which embodiments of the invention are shown. The same reference numerals in different drawings represent the same element.

Figure 6:
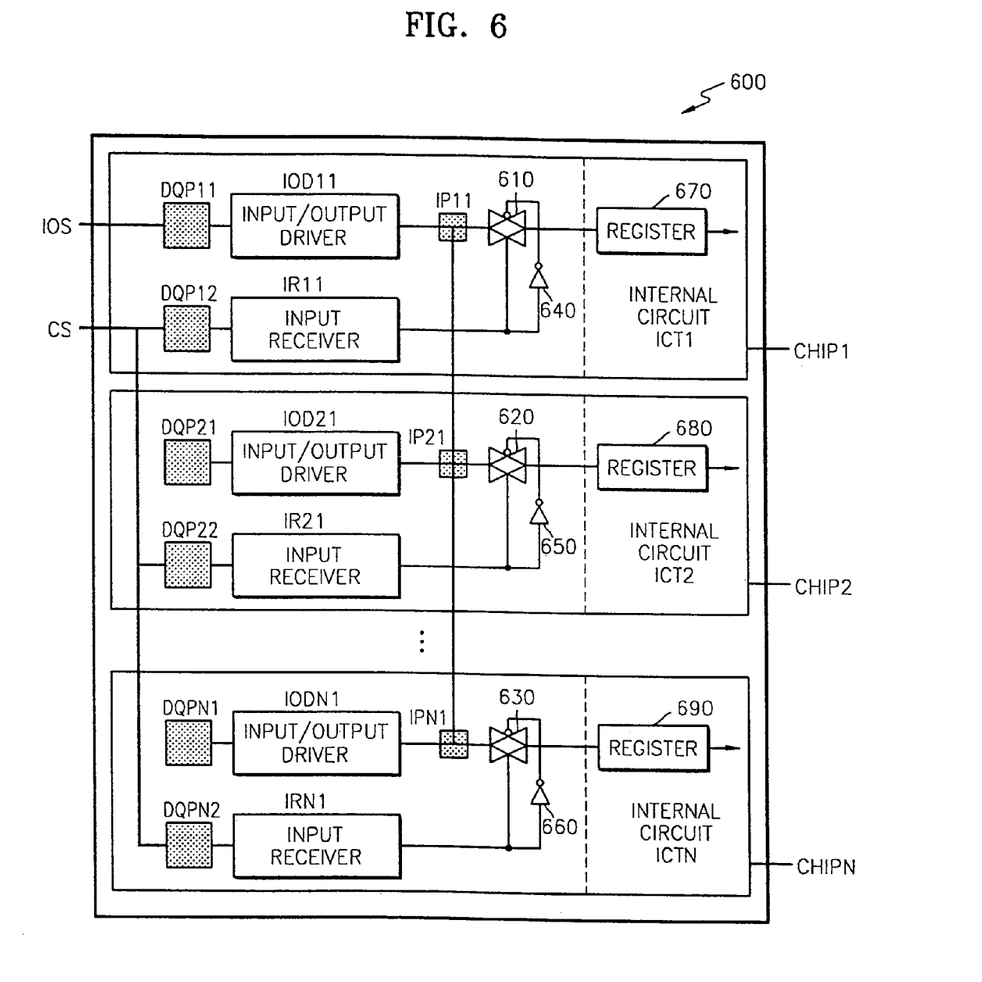
FIG. 6 is a diagram of a multi-chip package according to a first embodiment.

FIG. 6 is a diagram of a multi-chip package according to a first embodiment.

The multi-chip package 600 of FIG. 6 includes first through Nth semiconductor chips CHIP1, CHIP2, . . . , and CHIPN. Here, N is a natural number. The first semiconductor chip CHIP1 includes input/output pads DQP11 and DQP12, an input/output driver IOD11 coupled to the input/output pad DQP11, and an internal circuit ICT1. The first semiconductor chip CHIP1 includes circuits 610 and 640, which transmit signals to the internal circuit ICT1 via the input/output driver IOD11. The configuration of each of the second through Nth semiconductor chips CHIP2-CHIPN is identical to that of the first semiconductor chip CHIP1.

Operations of the first semiconductor chip CHIP1 will be described hereinafter. An input/output signal IOS is transmitted to the first semiconductor chip CHIP1 via the input/output pad DQP11 and the input/output driver IOD11. Here, when a chip selection signal CS is set at a high level and transmitted via the input/output pad DQP12 and an input receiver IR11, the chip selection signal CS is sent to a transmission gate 610 directly and via an inverter 640, and then the transmission gate 610 is turned on. Then, the input/output signal IOS is transmitted to a register 670 of the internal circuit ICT1.

Operations of each of the second through Nth semiconductor chips CHIP2-CHIPN are the same as those of the first semiconductor chip CHIP1. Therefore, a description of those operations will be omitted here for brevity.

Each of the first through Nth semiconductor chips CHIP1-CHIPN includes internal pads IP11, IP21, . . . , and IPN1, which couple internal input/output drivers IOD11, IOD21, . . . , and IODN1 with internal circuits ICT1, ICT2, . . . , and ICTN. The internal pads IP11, IP21, . . . , and IPN1 of the first through Nth semiconductor chips CHIP1-CHIPN are coupled to each other via a common pad (not shown) installed at a substrate. The common pad (not shown) will be described later with respect to in FIG. 7. While the internal pads IP11, IP21, . . . , and IPN1 can be coupled by wire bonding, any other method of transmitting signals is also possible.

The input/output pad DQP11 of the first semiconductor chip CHIP1 directly receives the input/output signal IOS transmitted via a corresponding pin (not shown) of a multi-chip package 600. Also, the input/output pad DQP11 of the first semiconductor chip CHIP1 is bonded to an external pin (not shown) of the multi-chip package 600.

The second through Nth semiconductor chips CHIP2-CHIPN indirectly receive the input/output signal IOS via the internal pads IP11, IP21, . . . , and IPN1, coupled to each other, without passing through the outside of the multi-chip package 600.

In the conventional multi-chip package, all of the input/output signals are transmitted via the input/output pads of each semiconductor chip. However, in the multi-chip package 600, to minimize the parasitic load of a package pin, the input/output signal IOS is transmitted only to one of the semiconductor chips, i.e., the first semiconductor chip CHIP1. Because the input/output signal IOS is transmitted only to the input/output pad DQP11 of the first semiconductor chip CHIP1, the parasitic load of the multi-chip package 600 is the same as the parasitic load of a single semiconductor chip.

The chip selection circuit CS is coupled to the input/output pads DQP12, DQP22, and DQPN2 in the same manner as that of a typical multi-chip package. The parasitic load of the package pin receiving the chip selection signal CS is affected by all the N semiconductor chips CHIP1-CHIPN. Unlike with the input/output signal IOS, the parasitic load increases N-fold and signals can be simultaneously transmitted from the outside to the first through Nth semiconductor chips CHIP1-CHIPN.

In general, even if the parasitic load of the pin receiving the chip selection signal CS increases N-fold, as the parasitic load of a pin receiving the chip selection signal CS is less than that of a pin receiving the input/output signal IOS, operations of the multi-chip package 600 are performed without errors.

In the multi-chip package 600 of FIG. 6, the Nth semiconductor chip CHIPN indirectly receives the input/output signal IOS via the first through (N−1)th semiconductor chips CHIP1-CHIP(N−1). Therefore, it may take a longer time for the input/output signal IOS to arrive at the internal circuit ICTN of the Nth semiconductor chip CHIPN than at the internal circuit ICT1 of the first semiconductor chip CHIP1.

To solve this problem, each of the semiconductor chips CHIP1-CHIPN may include a delay circuit (not shown) capable of selectively delaying transmission time of the input/output signal IOS, so that each of the first through (N−1)th semiconductor chips CHIP1-CHIP(N−1) receives the input/output signal IOS at the moment the internal circuits ICT1-ICTN of the Nth semiconductor chip CHIPN receive the input/output signal IOS.

Figure 7:
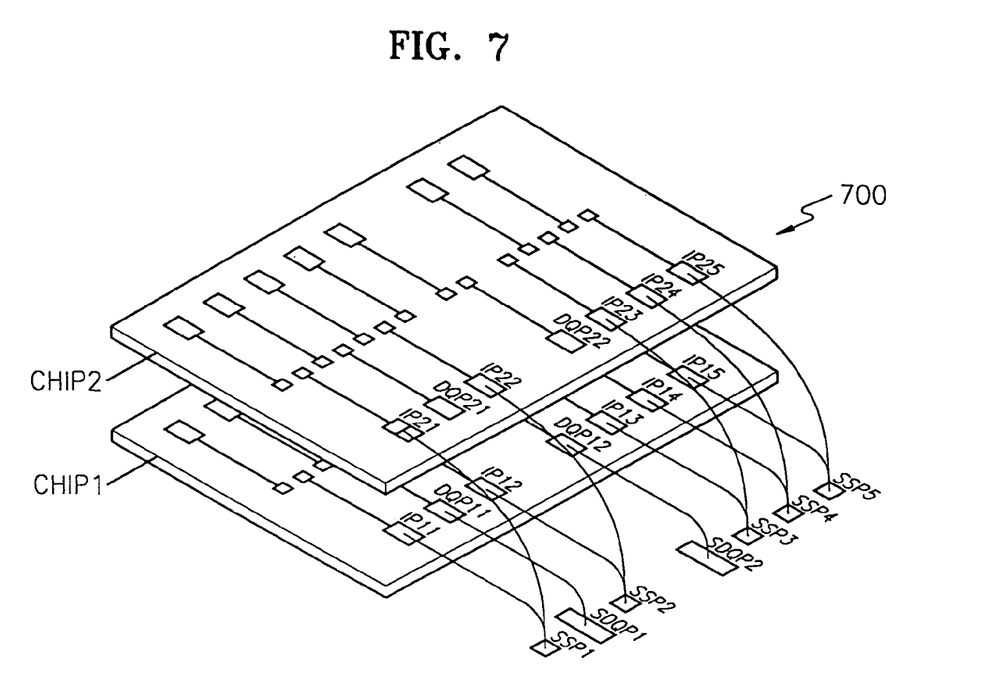
FIG. 7 is a diagram of an example of a method of connecting semiconductor chips in the multi-chip package of FIG. 6.

FIG. 7 is a diagram of an example of a method of coupling semiconductor chips in the multi-chip package of FIG. 6.

FIG. 7 illustrates only the first and second semiconductor chips CHIP1 and CHIP2. The coupling method will be described using the first and second semiconductor chips CHIP1 and CHIP2.

The first and second semiconductor chips CHIP1 and CHIP2 include the internal pads IP11, IP12, IP13, IP14, IP15, IP21, IP22, IP23, IP24, and IP25, which can be coupled by bonding for enabling signal transmission. When a pad is installed at an edge of a semiconductor chip, additional re-interconnection processes are not needed. However, when the pad is installed in the center of the semiconductor chip, a pad coupled to the central pad should be disposed again at the edge of the semiconductor chip.

The internal pads IP11, IP12, IP13, IP14, IP15, IP21, IP22, IP23, IP24, and IP25 are coupled to each other via common pads SSP1, SSP2, SSP3, SSP4, and SSP5 of a substrate. That is, the first internal pad IP11 of the first semiconductor chip CHIP1 and the first internal pad IP21 of the second semiconductor chip CHIP2 are commonly bonded to the first common pad SSP1. In the same manner, the second internal pad IP12 of the first semiconductor chip CHIP1 and the second internal pad IP22 of the second semiconductor chip CHIP2 are bonded to the second common pad SSP2, etc.

The first input/output pad DQP11 of the first semiconductor chip CHIP1, to which the input/output signal IOS is applied, is coupled to a pad SDQP1 of the substrate, and the pad SDQP1 is coupled to an external pin or ball of the multi-chip package.

The method of coupling the internal pads of the first and second semiconductor chips using the common pads SSP1, SSP2, SSP3, SSP4, and SSP5 is applicable when the input/output signal IOS is transmitted at a low speed. However, when the input/output signal IOS is transmitted at a high speed, a delay may be caused by the wire. Such a problem can be solved by the method of FIG. 8.

Figure 8:
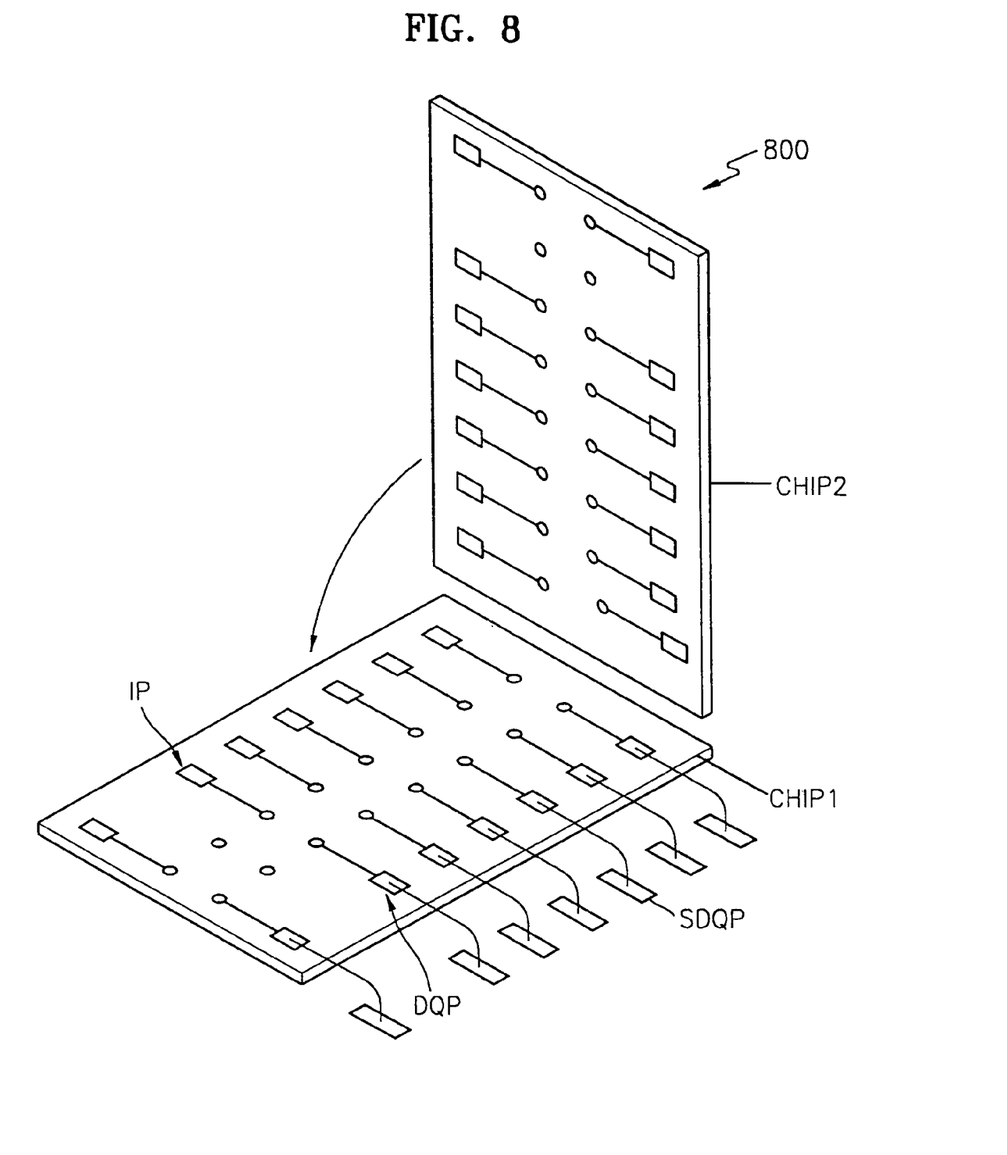
FIG. 8 is a diagram of another example of a method of connecting semiconductor chips in the multi-chip package of FIG. 6.

FIG. 8 is a diagram of another example of a method of coupling semiconductor chips in the multi-chip package of FIG. 6.

FIG. 8 illustrates a flip chip structure, in which a semiconductor chip is installed on another semiconductor chip. Pads other than the internal pad IP are coupled to a pad SDQP, which may be coupled by wire bonding. The lower semiconductor chip CHIP1 is coupled to a bonding finger (not shown) of the package by using wire bonding and thereby coupled to a terminal of the package.

Since the internal pad IP is not coupled to the terminal of the package, it is not coupled to the wire-bonded pad SDQP. To embody the same semiconductor chip into the flip chip structure, positions of bumps should be symmetrical.

Figure 9:
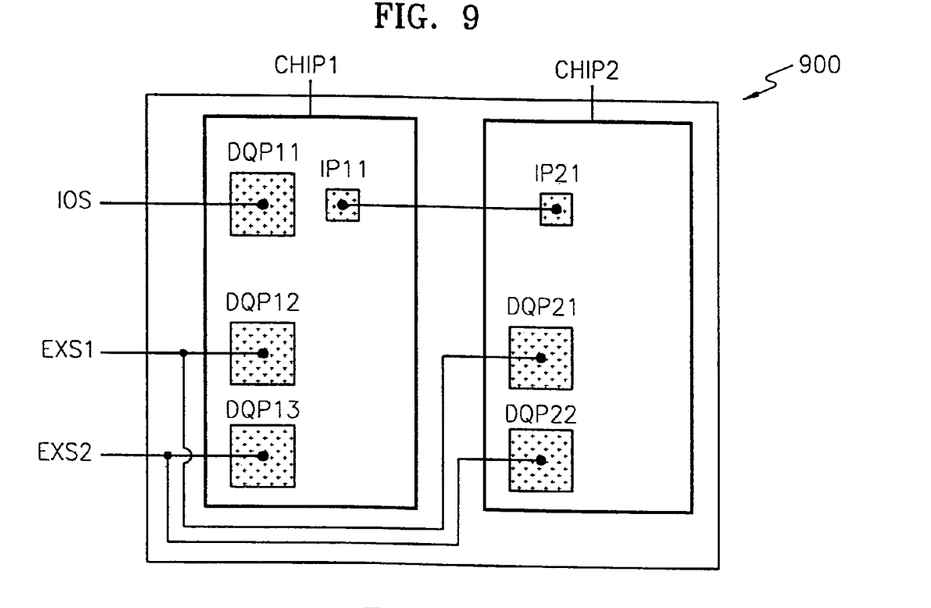
FIG. 9 is a diagram of a multi-chip package according to a second embodiment.

FIG. 9 is a diagram of a multi-chip package according to a second embodiment.

FIG. 9 illustrates a multi-chip package, in which the input/output signal IOS is directly transmitted to a semiconductor chip CHIP1 and indirectly transmitted to a semiconductor chip CHIP2 by using internal pads IP11 and IP21, while other signals are directly input to each of the semiconductor chip CHIP1 and CHIP2.

More specifically, like the multi-chip package 600 of FIG. 6, the multi-chip package 900 of FIG. 9 includes an input/output pad DQP11 and internal pads IP11 and IP21. The input/output signal IOS is transmitted to the semiconductor chips CHIP1 and CHIP2 via the input/output pad DQP11 and the internal pads IP11 and IP21. Also, predetermined external signals EXS1 and EXS2 are applied to each of the semiconductor chips CHIP1 and CHIP2 via direct input/output pads DQP12, DQP13, DQP21, and DQP22 on the semiconductor chips CHIP1 and CHIP2. The external signals EXS1 and EXS2 are input via corresponding pins (not shown) of the multi-chip package 900.

In the second embodiment, the multi-chip package 900 can select signals transmitted to the semiconductor chips CHIP1 and CHIP2 using the internal pads IP11 and IP21.

That is, address signals and commands, which cause a small parasitic load to a package pin or are not restricted by a transmission rate, are transmitted to the semiconductor chips CHIP1 and CHIP2 using the direct input/output pads DQP12, DQP13, DQP21, and DQP22. By comparison, signals such as the input/output signal IOS, which cause intense parasitic load to a package pin or require high-speed transmission, are applied to the semiconductor chips CHIP1 and CHIP2 by using the internal signals IP11 and IP21.

Figure 10:
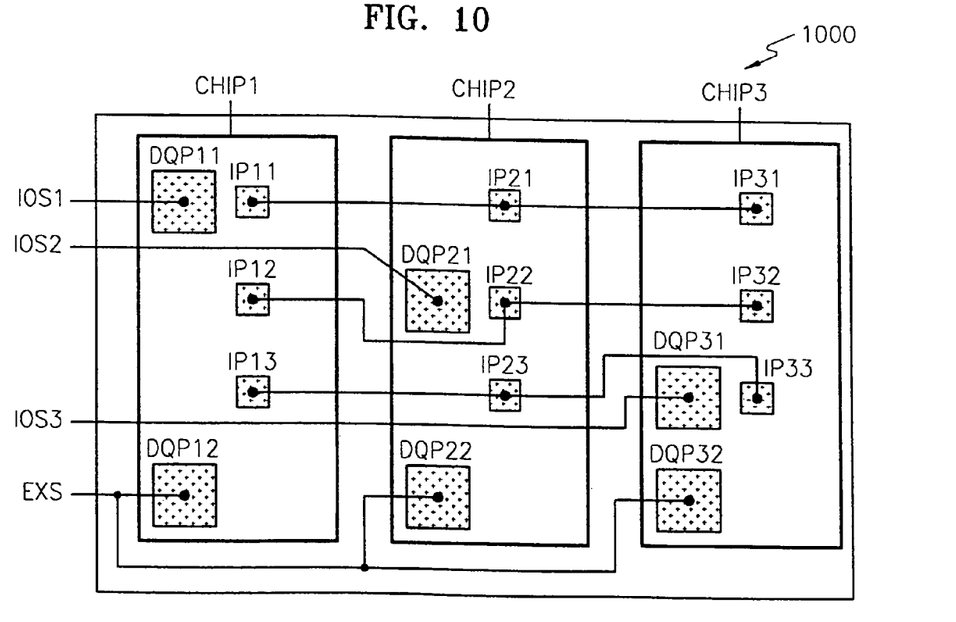
FIG. 10 is a diagram of a multi-chip package according to a third embodiment.

FIG. 10 is a diagram of a multi-chip package according to a third embodiment.

Referring to FIG. 10, the multi-chip package 1000 according to the third embodiment comprises first through Nth semiconductor chips CHIP1, CHIP2, and CHIP3, each of which includes first through 3rd input/output pads DQP11, DQP21, and DQP31, first through Nth input/output drivers (not shown) coupled to the input/output pads DQP11, DQP21, and DQP31, and an internal circuit (not shown).

Each of the first through 3rd semiconductor chips CHIP1, CHIP2, and CHIP3 includes first through 3rd internal pads IP11, IP12, IP13, IP21, IP22, IP23, IP31, IP32, and IP33, which couple the internal input/output drivers (not shown) and the internal circuit (not shown). The first through 3rd internal pads IP11, IP12, and IP13 of the first semiconductor chip CHIP1 are coupled to the second and third internal pads IP21, IP22, IP23, IP31, IP32, and IP33 corresponding thereto of the second and third through Nth semiconductor chips CHIP2 and CHIP3.

Predetermined first through 3rd input/output signals IOS1, IOS2, and IOS3 are received via corresponding pins of the multi-chip package 1000. An input/output signal for each semiconductor chip is directly received by the corresponding input/output pad. The first through 3rd semiconductor chips CHIP1, CHIP2, and CHIP3 indirectly receive the input/output signals IOS1-IOS3 via the corresponding internal pads IP11, IP12, IP13, IP21, IP22, IP23, IP31, IP32, and IP33, which are coupled to each other.

According to the embodiment of FIG. 10, the input/output pads, to which the input/output signal is transmitted, are dispersed in several chips in order to minimize the noise caused by the input/output pads of the semiconductor chip.

In the first embodiment of FIG. 6, a single input/output signal IOS is transmitted to N (e.g.=3) semiconductor chips. By comparison, in the third embodiment shown in FIG. 10, N input/output signals IOS1, IOS2, and IOS3 are transmitted to N=3 semiconductor chips CHIP1, CHIP2, and CHIP3. Thus, N=3 input/output pads DQP11, DQP21, and DQP31 are required.

The N=3 input/output pads DQP11, DQP21, and DQP31, to which the input/output signals IOS1, IOS2, and IOS3 are directly transmitted, are dispersed in the N=3 semiconductor chips CHIP1, CHIP2, and CHIP3, thereby enabling minimization of noise. Referring to FIG. 10, the input/output pad DQP11, to which the first input/output signal IOS1 is directly transmitted, is installed on the first semiconductor chip CHIP1. The first input/output signal IOS1 is indirectly transmitted to the second and third semiconductor chips CHIP2, and CHIP3 via internal pads IP11, IP21, and IP31.

The input/output pad DQP21, to which the second input/output signal IOS2 is directly transmitted, is installed on the second semiconductor chip CHIP2. The second input/output signal IOS2 is indirectly transmitted to the first and third semiconductor chips CHIP1 and CHIP3 via internal pads IP12, IP22, and IP32.

The input/output pad DQP31, to which the third input/output signal IOS3 is directly transmitted, is installed on the third semiconductor chip CHIP3. The third input/output signal IOS3 is indirectly transmitted to the first and second semiconductor chips CHIP1 and CHIP2 via internal pads IP13, IP23, and IP33.

The first through 3rd input/output signals IOS1, IOS2, and IOS3 may be identical signals or respectively different signals.

The first through 3rd semiconductor chips CHIP1, CHIP2, and CHIP3 further include direct input/output pads DQP12, DQP22, and DQP32, which directly receive a predetermined external signal EXS input via corresponding pins (not shown) of the multi-chip package 1000. The external signal EXS is transmitted at a lower speed than the input/output signal IOS.

In similarity to the embodiment of FIG. 9, in the multi-chip package 1000 of FIG. 10, the signal may be transmitted to a semiconductor chip depending on a feature of the signal by using internal pads IP11, IP12, IP13, IP21, IP22, IP23, IP31, IP32, and IP33, or directly via direct input/output pads DQP12, DQP22, and DQP32.

The internal pads IP11, IP12, IP13, IP21, IP22, IP23, IP31, IP32, and IP33 can be coupled by using a common pad (not shown) installed at a substrate, in similarity to the first embodiment of FIG. 6. Also, the first through 3rd semiconductor chips CHIP1, CHIP2, and CHIP3 may include delay circuits (not shown) for controlling delay times of the input/output signals IOS1, IOS2, and IOS3, such that the input/output signals IOS1, IOS2, and IOS3 received by the first through 3rd semiconductor chips CHIP1, CHIP2, and CHIP3 are simultaneously input to the respective internal circuits.

Figure 11:
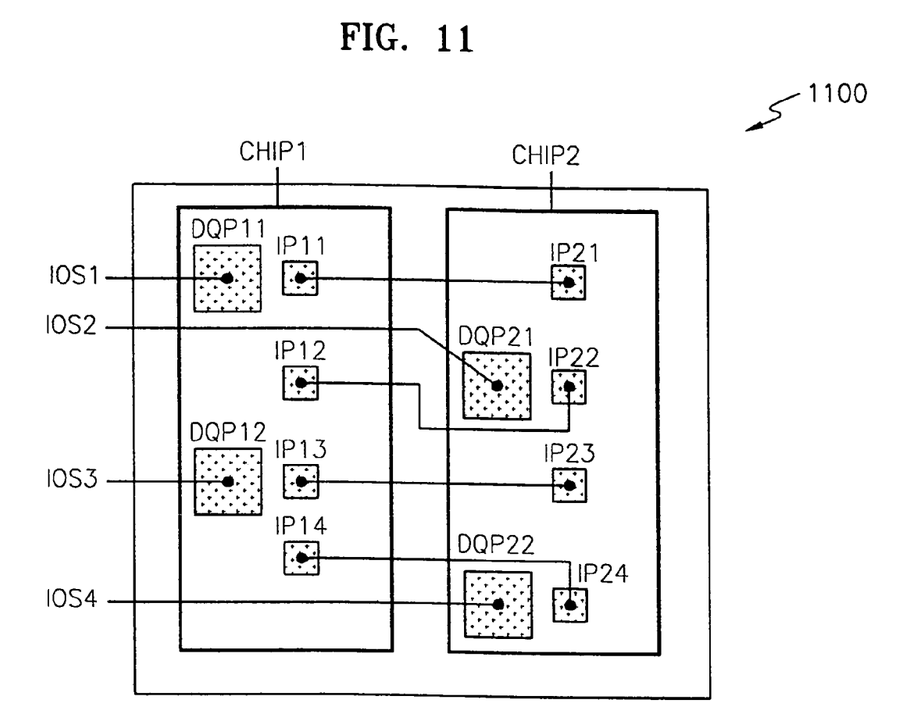
FIG. 11 is a diagram of a multi-chip package according to a fourth embodiment.

FIG. 11 is a diagram of a multi-chip package according to a fourth embodiment.

The multi-chip package 1100 according to the fourth embodiment comprises first and second semiconductor chips CHIP1 and CHIP2, each of which includes a plurality of input/output pads DQP11, DQP12, DPQ21, and DQP22, a plurality of input/output drivers (not shown) coupled to the input/output pads, and an internal circuit (not shown). Each of the first and second semiconductor chips CHIP1 and CHIP2 includes internal pads IP11, IP12, IP13, IP14, IP21, IP22, IP23, and IP24. The total number of internal pads used for coupling the internal input/output drivers (not shown) with the internal circuits (not shown) equals the number of input/output drivers (not shown). The plurality of internal pads IP11, IP12, IP13, and IP14 in the first semiconductor chip CHIP1 are coupled to the plurality of internal pads IP21, IP22, IP23, and IP24 corresponding thereto in the 2nd semiconductor chip.

Among predetermined first through Mth (M>N, M is a natural number) input/output signals IOS1-IOS4 received via pins (not shown) of the multi-chip package 1100, the input/output signals are divided and transmitted directly to the input/output pads of the first and second semiconductor chips CHIP1 and CHIP2. The first and second semiconductor chips CHIP1 and CHIP2 indirectly receive the other input/output signals via the corresponding internal pads IP11, IP12, IP13, IP14, IP21, IP22, IP23, and IP24, which are coupled to each other.

Here, we suppose that N is set to 2 and M is set to 4.

In the third embodiment shown in FIG. 10, if the number of the input/output signals IOS1, IOS2, and IOS3 is equal to that of the semiconductor chips CHIP1, CHIP2, and CHIP3, an individual input/output signal is directly transmitted to only one semiconductor chip, and the other input/output signals are indirectly transmitted to the other semiconductor chips via internal pads.

In the fourth embodiment shown in FIG. 11, in similarity to the third embodiment, multiple input/output pads, to which input/output signals are transmitted, are divided and installed to reduce noise. However, unlike the third embodiment, the number of the input/output signals is more than that of the semiconductor chips. Similarly, if the input/output signals are divided into a proper number and then dispersed appropriately in semiconductor chips, the noise can be minimized.

In FIG. 11, there are 4 input/output signals IOS1, IOS2, IOS3, and IOS4 and 2 semiconductor chips CHIP1 and CHIP2. Thus, if 2 input/output signals are applied to each semiconductor chip, the noise caused by input/output pads, to which the input/output signals are transmitted, can be minimized in each semiconductor chip.

The internal pads IP11, IP12, IP13, IP14, IP21, IP22, IP23, and IP24 can be coupled using a common pad (not shown) installed at a substrate in similarity to the first embodiment shown in FIG. 6. Also, the first and second semiconductor chips CHIP1 and CHIP2 may include delay circuits (not shown) for controlling delay times of the input/output signals IOS1, IOS2, IOS3, and IOS4, such that the input/output signals IOS1, IOS2, IOS3, and IOS4 received by the first and second semiconductor chips CHIP1 and CHIP2 are simultaneously input to the respective internal circuits.

In similarity to the embodiment in FIG. 10, depending on a feature of the signal transmitted to the multi-chip package 1100 of FIG. 11, the signal can be transmitted to a semiconductor chip using the internal pads IP11, IP12, IP13, IP14, IP21, IP22, IP23, and IP24, or directly via direct input/output pads. This can be embodied by installing the direct input/output pads on each semiconductor chip as shown in FIG. 10.

As described above, the multi-chip package can improve signal compatibility by maintaining the parasitic load of a pin to at least the level of a single chip, when a signal is transmitted to the pin at high speed. Also, when a signal that is not necessarily transmitted at high speed is applied to a pin, semiconductor chips can be packaged according to the conventional method.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A multi-chip package comprising:
    first through Nth semiconductor chips, each of which includes an input/output pad, an input/output driver coupled to the input/output pad, an internal circuit, and an internal pad disposed in a signal path in between the input/output driver and the internal circuit,
    wherein the internal pads of the first through Nth semiconductor chips are coupled to each other,
    wherein the input/output pad of the first semiconductor chip directly receives an input/output signal transmitted via a corresponding pin of the multi-chip package,
    wherein the second through Nth semiconductor chips indirectly receive the input/output signal via the internal pads, which are coupled to each other,
    and wherein the first through Nth semiconductor chips include direct input/output pads which directly receive external signals input via corresponding pins of the multi-chip package.

2. The multi-chip package as claimed in claim 1, wherein the internal pads are coupled to each other via a common pad installed at a substrate.

3. The multi-chip package as claimed in claim 1, wherein the input/output pad of the first semiconductor chip is bonded to an external pin of the multi-chip package.

4. The multi-chip package as claimed in claim 1, wherein each of the first through (N-1)th semiconductor chips includes a delay circuit for receiving the input/output signal simultaneously with the internal circuit of the Nth semiconductor chip.

5. The multi-chip package as claimed in claim 1, wherein the external signals are transmitted at a lower speed than the input/output signal.

6. The multi-chip package of claim 1, wherein the second through Nth semiconductor chips receive the input/output signal via first semiconductor chip.

7. The multi-chip package of claim 1, wherein the second through Nth semiconductor chips receive the input/output signal via the input/output driver of the first semiconductor chip.

8. A multi-chip package comprising:
    first through Nth semiconductor chips, each of which includes an input/output pad, an input/output driver coupled to the input/output pad, an internal circuit, and an internal pad disposed in a signal path in between the input/output driver and the internal circuit,
    wherein the internal pads of the first through Nth semiconductor chips are coupled to each other,
    wherein the input/output pad of the first semiconductor chip is directly connected to a corresponding pin of the multi-chip package,
    wherein the first through Nth semiconductor chips also include direct input/output pads which are directly coupled to corresponding pins of the multi-chip package,
    wherein the first semiconductor chip communicates an input/output signal with the corresponding pin of the multi-chip package via the direct connection to the input/output pad of the first semiconductor chip, and
    wherein the second through Nth semiconductor chips indirectly communicate the input/output signal with the corresponding pin of the multi-chip package via the first semiconductor chip.

9. The multi-chip package of claim 8, wherein the internal pads are coupled to each other via a common pad installed at a substrate.

10. The multi-chip package of claim 8, wherein the external signals are transmitted at a lower speed than the input/output signal.

11. The multi-chip package of claim 8, wherein the second through Nth semiconductor chips communicate the input/output signal with the corresponding pin of the multi-chip package via the input/output driver of the first semiconductor chip.

* * * * *